(12) United States Patent
Nabetani

(10) Patent No.: US 7,560,931 B2
(45) Date of Patent: Jul. 14, 2009

(54) SWITCHING DEVICE COMPATIBLE WITH RF COIL AND MAGNETIC RESONANCE IMAGING SYSTEM

(75) Inventor: Akira Nabetani, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 219 days.

(21) Appl. No.: 11/407,312

(22) Filed: Apr. 19, 2006

(65) Prior Publication Data

US 2006/0238198 A1    Oct. 26, 2006

(30) Foreign Application Priority Data

Apr. 22, 2005   (JP) ............... 2005-124733

(51) Int. Cl.
    *G01V 3/00*   (2006.01)
(52) U.S. Cl. ........................ 324/322; 324/318
(58) Field of Classification Search ......... 324/300–322; 600/407–435; 333/219–235, 207, 113; 335/296–306; 330/4.9, 4.6
    See application file for complete search history.

(56) References Cited

U.S. PATENT DOCUMENTS

| | | | | |
|---|---|---|---|---|
| 2,576,833 A | * | 11/1951 | Goodall | 329/322 |
| 2,688,699 A | * | 9/1954 | Hiehle | 455/80 |
| 3,012,203 A | * | 12/1961 | King | 330/4.6 |
| 3,131,358 A | * | 4/1964 | Schreiner | 330/4.6 |
| 3,175,164 A | * | 3/1965 | Schreiner | 330/4.9 |
| 3,193,779 A | * | 7/1965 | Beaty | 331/98 |
| 3,212,018 A | * | 10/1965 | Amoss et al. | 330/4.9 |
| 3,221,276 A | * | 11/1965 | Stern | 333/113 |
| 3,462,696 A | * | 8/1969 | Heinlein | 330/4.9 |
| 3,513,403 A | * | 5/1970 | Chang | 330/4.9 |
| 4,004,257 A | * | 1/1977 | Geissler | 333/207 |
| 4,737,705 A | * | 4/1988 | Bitar et al. | 324/635 |
| 4,742,304 A | | 5/1988 | Schnall et al. | |
| 4,782,298 A | | 11/1988 | Aralawa et al. | |
| 4,788,503 A | | 11/1988 | Van Heelsbergen | |
| 4,833,409 A | | 5/1989 | Eash | |
| 4,916,398 A | | 4/1990 | Rath | |
| 4,952,879 A | | 8/1990 | Van Vaals et al. | |
| 5,274,332 A | | 12/1993 | Jaskolski et al. | |
| 5,329,233 A | * | 7/1994 | Hayes | 324/318 |
| 5,349,298 A | * | 9/1994 | Nakabayashi | 324/322 |

(Continued)

FOREIGN PATENT DOCUMENTS

DE    38 50 559 T2    12/1988

(Continued)

*Primary Examiner*—Brij B. Shrivastav
*Assistant Examiner*—Tiffany A Fetzner
(74) *Attorney, Agent, or Firm*—Armstrong Teasdale LLP

(57) ABSTRACT

With the objective of providing a switching apparatus capable of reducing a geometrical size while a radiation loss is being suppressed, the switching apparatus that switches a state of an RF coil of an MRI between an effective state and an ineffective state, comprises a coaxial cable which has a length equal to ¼ of a wavelength corresponding to an operating frequency and in which an inner conductor and an outer conductor are connected to a coil body of the RF coil so as to interpose a capacitor therebetween, a diode connected to the inner conductor and outer conductor of the coaxial cable, and a capacitor corresponding to a lumped constant element connected to the inner conductor and outer conductor of the coaxial cable.

20 Claims, 11 Drawing Sheets

U.S. PATENT DOCUMENTS

| | | | |
|---|---|---|---|
| 5,594,342 A | 1/1997 | Brey et al. | |
| 6,791,328 B1 | 9/2004 | Nabetani et al. | |
| 6,847,210 B1 * | 1/2005 | Eydelman et al. | 324/318 |
| 6,879,159 B2 | 4/2005 | Yoshida | |
| 2003/0158475 A1 * | 8/2003 | Johnson et al. | 600/410 |
| 2003/0164704 A1 | 9/2003 | Yoshida | |
| 2006/0238198 A1 * | 10/2006 | Nabetani | 324/318 |
| 2007/0106148 A1 * | 5/2007 | Dumoulin | 600/410 |

FOREIGN PATENT DOCUMENTS

| | | |
|---|---|---|
| EP | 0 276 510 A1 | 12/1987 |
| JP | 05220128 | 8/1993 |
| JP | 06254071 | 9/1994 |
| JP | 2004358259 A | 12/2004 |

* cited by examiner

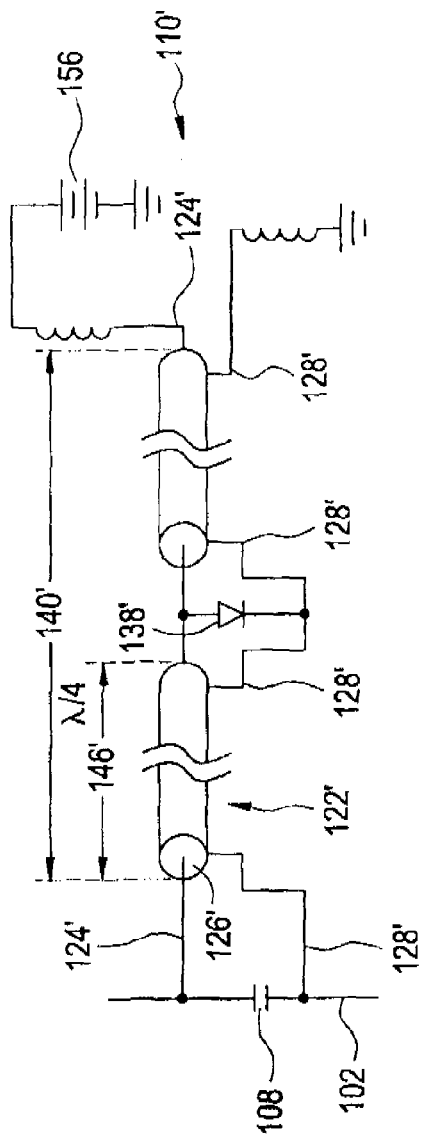
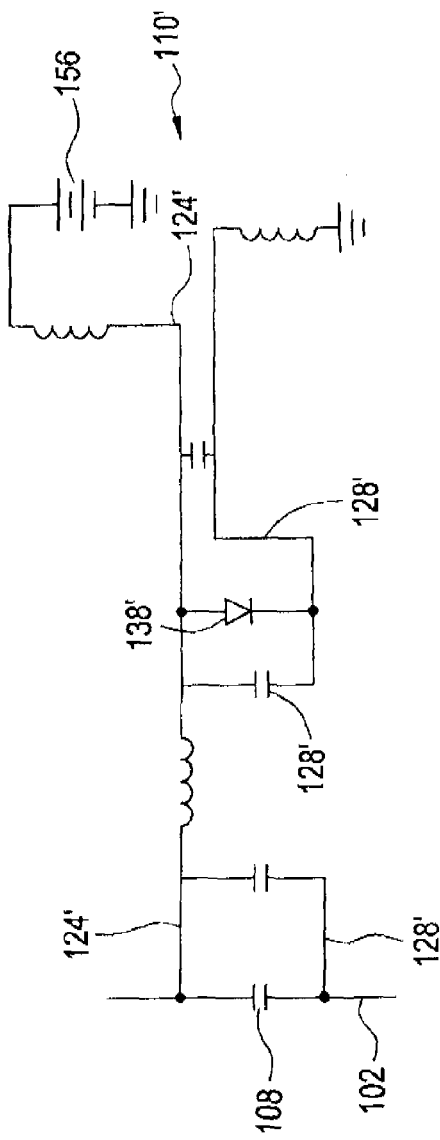

Electrical Characteristics of Coaxial Cable Having Short-Circuited End

Electrical Characteristics of Coaxial Cable Having Open End

PRIOR ART

Equivalent Circuit at Forward Bias

Equivalent Circuit at Reverse Bias

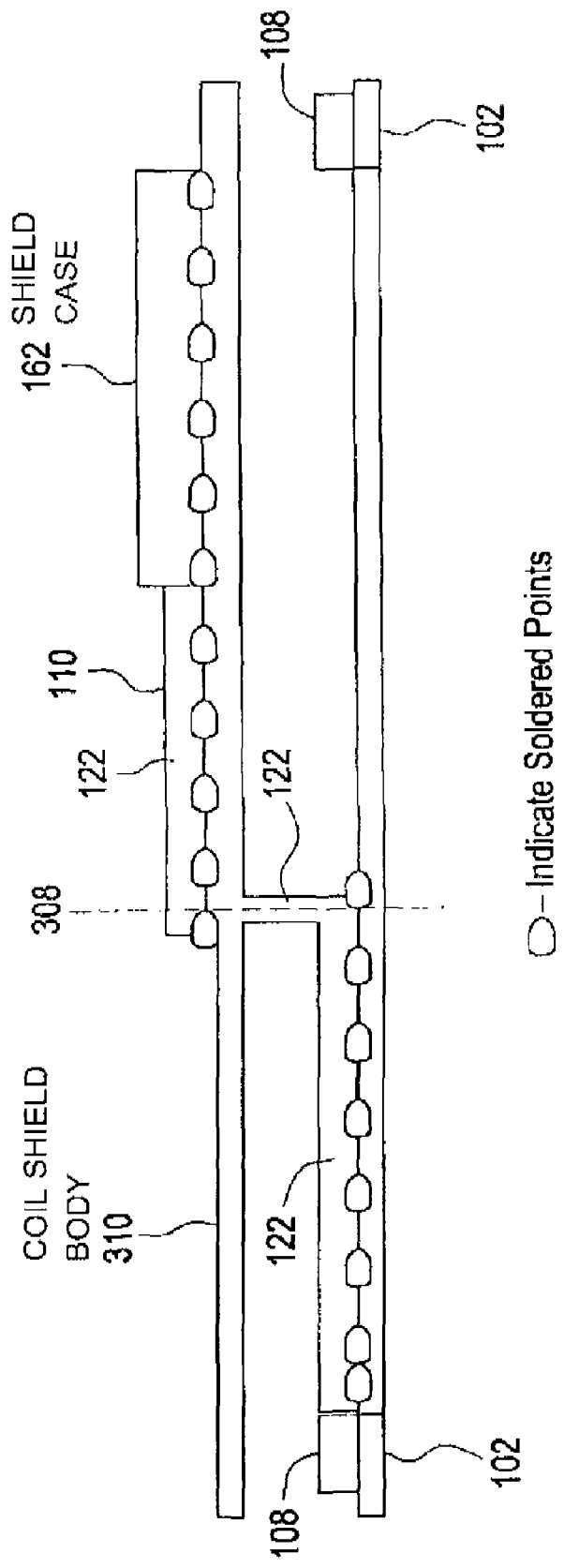

Equivalent Circuit at Reverse Bias

Equivalent Circuit at Forward Bias

SWITCHING DEVICE COMPATIBLE WITH RF COIL AND MAGNETIC RESONANCE IMAGING SYSTEM

CROSS REFERENCE TO RELATED APPLICATIONS

This application claims the benefit of Japanese Application No. 2005-124733 filed Apr. 22, 2005.

BACKGROUND OF THE INVENTION

The present invention relates to a switching apparatus, an RF coil, and a magnetic resonance imaging apparatus.

Since a plurality of RF coils (such as a body coil and a head coil) might be used in a magnetic resonance imaging apparatus, there is a need to avoid coupling among these RF coils. Therefore, there might be provided a switching apparatus for eliminating the characteristic as a resonant circuit by shifting a resonant frequency of a resonant loop or cutting the loop. Incidentally, the switching apparatus is generally identified by names such as "Dynamic disabling switch", a detuner, etc.

Since the frequency of a signal of the magnetic resonance imaging apparatus is relatively high, a radiation loss of energy occurs even in the switching apparatus. Therefore, a patent document 1 discloses a technique wherein a switching apparatus (dynamic disabling switch) is configured by a distributed constant circuit and a coaxial cable low in radiation loss of energy is used as a distributed constant element to thereby suppress the radiation loss.

[Patent Document 1] Japanese Unexamined Patent Publication No. 2004-358259

If, however, the switching apparatus is configured by the distributed constant circuit, then the geometrical size of the switching apparatus is affected by required circuit characteristics. On the other hand, the size of the RF coil may preferably be set in accordance with the size of a subject or a region intended for imaging of the subject. The size of the switching apparatus based on the circuit characteristics, and the size of the RF coil based on the imaging object do not necessarily coincide with each other. Since the switching apparatus is disposed in the RF coil, there is a need to allow one size or the like to coincide with the other size or the like. If the size of the RF coil is increased in accordance with the size of the switching apparatus where the switching apparatus is larger than the RF coil, then it exerts an influence on the mountability of the coil onto the subject. If the coaxial cable of the distributed constant circuit is waved in accordance with the size of the RF coil, for example, then a manufacturing process becomes complex.

SUMMARY OF THE INVENTION

Therefore, an object of the present invention is to provide a switching apparatus capable of reducing a geometrical size while a radiation loss is being suppressed, an RF coil and a magnetic resonance imaging apparatus.

There is provided a switching apparatus according to a first aspect of the present invention, which switches a state of an RF coil of a magnetic resonance imaging apparatus between a state in which a resonant circuit with a predetermined operating frequency as a resonant frequency is configured, and a state in which a resonant circuit or a non-resonant circuit having another resonant frequency is configured, comprising a coaxial cable having a length equal to an odd multiple of ¼ of a wavelength corresponding to the operating frequency, said coaxial cable including one end side at which an inner conductor is connected to one side of a coil electrostatic capacitive element contained in the RF coil and an outer conductor is connected to the other side of the coil electrostatic capacitive element, and the other end side from which a bias is applied; a diode connected to the inner conductor and the outer conductor at the other end of the coaxial cable; and a lumped constant element connected to the inner conductor and the outer conductor at the other end of the coaxial cable, and having a predetermined electrostatic capacitance.

Preferably, the electrostatic capacitance of the lumped constant element is set in such a manner that when a bias is applied to the other end of the coaxial cable in a direction in which no current flows through the diode, the resonant circuit with the operating frequency as the resonant frequency is constituted of the coil electrostatic capacitive element, the coaxial cable and the lumped constant element.

Preferably, the lumped constant element is a ceramic capacitor.

There is provided a switching apparatus according to a second aspect of the present invention, which switches a state of an RF coil of a magnetic resonance imaging apparatus between a state in which a resonant circuit with a predetermined operating frequency as a resonant frequency is configured, and a state in which a resonant circuit or a non-resonant circuit having another resonant frequency is configured, the switching apparatus comprising a coaxial cable including one end side at which an inner conductor is connected to one side of a coil electrostatic capacitive element contained in the RF coil and an outer conductor is connected to the other side of the coil electrostatic capacitive element, and the other end side from which a bias is applied; a diode connected to the inner conductor and the outer conductor at the other end of the coaxial cable; and a lumped constant element connected to the inner conductor and the outer conductor at the other end of the coaxial cable, the lumped constant element having such an inductance that when a bias is applied to the other end of the coaxial cable in a direction in which no current flows through the diode, the combined impedance thereof with the coaxial cable becomes equivalent to the impedance of the coaxial cable whose other end is short-circuited with a length equal to an odd multiple of ¼ of a wavelength corresponding to the operating frequency.

Preferably, the length of the coaxial cable is set in such a manner that when a bias is applied to the other end of the coaxial cable in a direction in which a current flows through the diode, the resonant circuit with the operating frequency as the resonant frequency is constituted of the coaxial cable and the coil electrostatic capacitive element.

Preferably, the switching apparatus includes a first inductance element connected in series with the inner conductor at the other end side of the coaxial cable than the lumped constant element, and a second inductance element connected in series with the outer conductor at the other end side of the coaxial cable than the lumped constant element. A bias is applied to the coaxial cable via the first and second inductance elements.

Preferably, the switching apparatus further includes a shield body for the switching apparatus, which is comprised of a non-magnetic material having conductivity and covers the lumped constant element.

Preferably, the switching apparatus further includes a first electrostatic capacitive element connected to the inner conductor and connected to a reference potential at the other end side of the coaxial cable than the lumped constant element, and a second electrostatic capacitive element connected to the outer conductor and connected to the reference potential at the other end side of the coaxial cable than the lumped constant element.

Preferably, the operating frequency is 64 MHz or more.

There is provided an RF coil suitable for use in a magnetic resonance imaging apparatus, according to a third aspect of the present invention, comprising a coil conductor; a coil electrostatic capacitive element connected to the coil conductor; and a switching apparatus which switches a state of a circuit including the coil conductor and the coil electrostatic capacitive element between a state in which a resonant circuit with a predetermined operating frequency as a resonant frequency is configured, and a state in which a resonant circuit or a non-resonant circuit having another resonant frequency is configured, wherein the switching apparatus includes a coaxial cable having a length equal to an odd multiple of ¼ of a wavelength corresponding to the operating frequency, the coaxial cable including one end side at which an inner conductor is connected to one side of the coil electrostatic capacitive element and an outer conductor is connected to the other side of the coil electrostatic capacitive element, and the other end side from which a bias is applied, a diode connected to the inner conductor and the outer conductor at the other end of the coaxial cable, and a lumped constant element connected to the inner conductor and the outer conductor at the other end of the coaxial cable, and having a predetermined electrostatic capacitance.

There is provided an RF coil suitable for use in a magnetic resonance imaging apparatus, according to a fourth aspect of the present invention, comprising a coil conductor; a coil electrostatic capacitive element connected to the coil conductor; and a switching apparatus which switches a state of a circuit including the coil conductor and the coil electrostatic capacitive element between a state in which a resonant circuit with a predetermined operating frequency as a resonant frequency is configured, and a state in which a resonant circuit or a non-resonant circuit having another resonant frequency is configured, wherein the switching apparatus includes a coaxial cable including one end side at which an inner conductor is connected to one side of a coil electrostatic capacitive element contained in the RF coil and an outer conductor is connected to the other side of the coil electrostatic capacitive element, and the other end side from which a bias is applied, a diode connected to the inner conductor and the outer conductor at the other end of the coaxial cable, and a lumped constant element connected to the inner conductor and the outer conductor at the other end of the coaxial cable, the lumped constant element having such an inductance that when a bias is applied to the other end of the coaxial cable in a direction in which no current flows through the diode, the combined impedance thereof with the coaxial cable becomes equivalent to the impedance of the coaxial cable whose other end is short-circuited with a length equal to an odd multiple of ¼ of a wavelength corresponding to the operating frequency.

Preferably, the RF coil further includes a coil shield body which covers the coil conductor, and the coaxial cable has the one end disposed inside the coil shield body and the other end disposed outside the coil shield body, and the lumped constant element is disposed outside the coil shield body.

Preferably, the switching apparatus further includes a switching apparatus shield body which covers the lumped constant element outside the coil shield body, and the switching apparatus shield body is fixed to the coil shield body by fixing means having conductivity.

There is provided a magnetic resonance imaging apparatus according to a fifth aspect of the present invention, comprising static magnetic field forming means which forms a static magnetic field; tilt magnetic field forming means which forms a tilt magnetic field; high-frequency magnetic field forming means which forms a high-frequency magnetic field at a subject lying within the static magnetic field; magnetic resonance signal receiving means which receives a magnetic resonance signal from the subject; image forming means which forms an image of the subject on the basis of the magnetic resonance signal received by the magnetic resonance signal receiving means; bias input means which applies a bias to an RF coil included in at least any one of the high-frequency magnetic filed forming means and the magnetic resonance signal receiving means; and control means which controls the operation of the bias input means, wherein the RF coil includes a coil conductor, a coil electrostatic capacitive element connected to the coil conductor, and a switching apparatus which switches a state of a circuit including the coil conductor and the coil electrostatic capacitive element between a state in which a resonant circuit with a predetermined operating frequency as a resonant frequency is configured, and a state in which a resonant circuit or a non-resonant circuit having another resonant frequency is configured, and wherein the switching apparatus includes a coaxial cable having a length equal to an odd multiple of ¼ of a wavelength corresponding to the operating frequency, the coaxial cable including one end side at which an inner conductor is connected to one side of the coil electrostatic capacitive element and an outer conductor is connected to the other side of the coil electrostatic capacitive element, and the other end side to which the bias input means is connected, a diode connected to the inner conductor and the outer conductor at the other end of the coaxial cable, and a lumped constant element connected to the inner conductor and the outer conductor at the other end of the coaxial cable, and having a predetermined electrostatic capacitance.

There is provided a magnetic resonance imaging apparatus according to a sixth aspect of the present invention, comprising static magnetic field forming means which forms a static magnetic field; tilt magnetic field forming means which forms a tilt magnetic field; high-frequency magnetic field forming means which forms a high-frequency magnetic field at a subject lying within the static magnetic field; magnetic resonance signal receiving means which receives a magnetic resonance signal from the subject; image forming means which forms an image of the subject on the basis of the magnetic resonance signal received by the magnetic resonance signal receiving means; bias input means which applies a bias to an RF coil contained in at least any one of the high-frequency magnetic filed forming means and the magnetic resonance signal receiving means; and control means which controls the operation of the bias input means, wherein the RF coil includes a coil conductor, a coil electrostatic capacitive element connected to the coil conductor, and a switching apparatus which switches a state of a circuit including the coil conductor and the coil electrostatic capacitive element between a state in which a resonant circuit with a predetermined operating frequency as a resonant frequency is configured, and a state in which a resonant circuit or a non-resonant circuit having another resonant frequency is configured, and wherein the switching apparatus includes a coaxial cable including one end side at which an inner conductor is connected to one side of a coil electrostatic capacitive element contained in the RF coil and an outer conductor is connected to the other side of the coil electrostatic capacitive element, and the other end side to which the bias input means is connected, a diode connected to the inner conductor and the outer conductor at the other end of the coaxial cable, and a lumped constant element connected to the inner conductor and the outer conductor at the other end of the coaxial cable, the lumped constant element having such an inductance that when a bias is applied to the other end of the coaxial cable in a direction in which no current flows through the diode, the combined impedance thereof with the coaxial cable becomes equivalent to the impedance of the coaxial cable whose other end is short-circuited with a length equal to an odd multiple of ¼ of a wavelength corresponding to the operating frequency.

Preferably, the control means controls the bias input means in such a manner that the direction of the bias applied to the coaxial cable is a reverse direction upon formation of the high-frequency magnetic field by the high-frequency magnetic field forming means and reception of the magnetic resonance signal by the magnetic resonance signal receiving means.

According to the switching apparatus of the present invention, a geometrical size can be reduced while a radiation loss is being suppressed.

Further objects and advantages of the present invention will be apparent from the following description of the preferred embodiments of the invention as illustrated in the accompanying drawings.

BRIEF DESCRIPTION OF THE DRAWINGS

FIGS. 3a and 3b are circuit diagrams depicting a configuration of a conventional switching apparatus.

FIG. 8 is a sectional view taken along an ABCD plane of FIG. 7.

DETAILED DESCRIPTION OF THE INVENTION

First Embodiment

Figure 1:
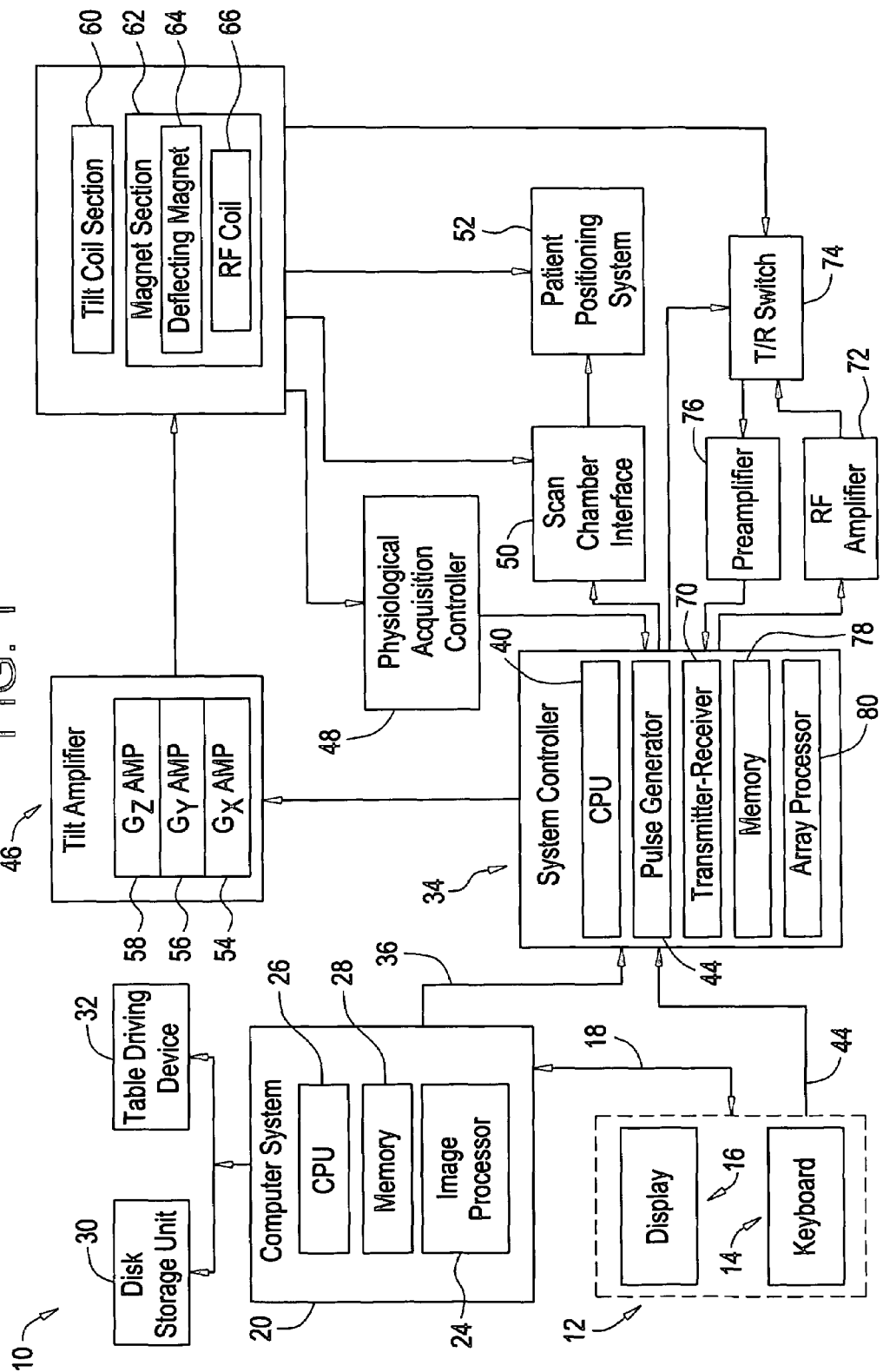
FIG. 1 is a block diagram showing a configuration of a magnetic resonance imaging apparatus according to a first embodiment of the present invention.

FIG. 1 is a block diagram of a magnetic resonance imaging apparatus (MRI) 10 according to a first embodiment of the present invention. The MRI 10 includes an operator console 12 including a keyboard and control panel 14, and a display 16. The operator console 12 is in communication with an independent computer system 20 via a link 18. Thus, an operator is able to control the creation and display of an image on the screen 16.

The computer system 20 includes a plurality of modules caused to communicate with one another through a backplane. For instance, the computer system 20 includes an image processor module 24, a CPU module 26, and a memory module 28 for storing an image data array therein, which might be called "frame buffer" in the present specification. The computer system 20 links a disk storage unit 30 and a tape driving device 32 to each other to facilitate storage of image data and programs. The computer system 20 communicates with an independent system controller 34 via a high-speed serial link 36.

The system controller 34 includes a plurality of modules electrically connected using a back plane (not shown). For instance, the system controller 34 includes a CPU module 40 and a pulse generator module 42 electrically connected to the operator console 12 using a serial link 44. The link 44 makes it easy to transmit/receive commands between the operator console 12 and the system controller 34. Thus, the operator is able to input a scan sequence that the operator tries to allow the MRI system 10 to execute.

The pulse generator modulator 42 operates a system component so as to execute a desired scan sequence and generates data for giving instructions as to the timing for an RF pulse to be generated and its intensity and shape, and the timing for a data acquisition window and its length. The pulse generator module 42 allows an electrical connection to a tilt amplifier system 46 and provides the tilt amplifier system 46 with a signal indicating the timing and shape of a tilt magnetic field pulse to be generated during scanning. Further, the pulse generator module 42 is configured so as to receive patient data from a physiological acquisition controller 48. The physiological acquisition controller 48 is configured so as to receive inputs such as ECG signals (however not limited thereto) obtained from electrodes mounted to a patient, which inputs indicate patient's physiological states and are sent from a plurality of sensors. The pulse generator module 42 is electrically connected to a scan chamber interface circuit 50. The scan chamber interface circuit 50 is configured so as to receive signals sent from various sensors, which represent patient's states and a magnet system. Further, the scan chamber interface circuit 50 is configured so as to transmit command signals such as a command signal (however not limited thereto) for moving the patient to a desired position, etc. to a patient positioning system 52.

A tilt waveform generated from the pulse generator module 42 is inputted to the tilt amplifier system 46 including a GX amplifier 54, a GY amplifier 56 and a GZ amplifier 58. The amplifiers 54, 56 and 58 respectively excite corresponding tilt coils (gradient field forming means) in a tilt coil section 60 to generate a plurality of magnetic field tilts used to position-encode collected signals. The MRI 10 includes a magnet section (static magnetic field forming means) 62 including a deflecting magnet 64 and a whole-body RF coil 66 therein. The magnet section 62 forms a static magnetic field thereinside. The magnitude of the static magnetic field ranges from 3T to 7T. An operating frequency of the RF coil 66 is, for example, 64 MHz or more, specifically, 130 MHz and 300 MHz.

A transmitter-receiver module 70 positioned within the system controller 34 generates a plurality of electrical pulses amplified by an RF amplifier 72 upon its use. The RF amplifier 72 is electrically connected to the RF coil 66 by using a transmit/receive switch 74. A signal obtained by emission based on excited atomic nuclei in the patient is detected by the RF coil 66, followed by being transmitted to a preamplifier 76 through the transmit/receive switch 74. Next, the so-amplified NMR (Nuclear Magnetic Resonance) signal is demodulated, filter-processed and digitized within a receiver section of the transmitter-receiver module 70. The transmit/receive switch 74 is controlled by a signal supplied from the pulse generator module 42 to electrically connect the RF amplifier 72 to the RF coil 66 in a transmission mode and electrically connect the preamplifier 76 and the same coil to each other in a reception mode. Further, the transmit/receive switch 74 makes it possible to use the single RF coil (e.g., surface coil) even in both transmission and reception modes.

The NMR signal received by the RF coil 66 is digitized by the transmitter-receiver module 70, which in turn is transferred to a memory module 78 lying in the system controller 34. Upon completion of scanning, arrays of untreated k space data are collected within the memory module 78. The untreated k space data are relocated so as to reach independent k space data arrays for reconstructing respective cardiac phase images. The respective k space data arrays are inputted to an array processor 80 configured so as to Fourier-transform data into arrays of image data. The image data are transmitted via the serial link 36 to the computer system 20 from which the data are stored in the disk storage unit 30. The image data can be archived onto the tape driving device 32 in accordance with a command received from the operator console 12. Alternatively, the image data are further processed by the image processor 24, which in turn are sent to the operator console 12, where the image data can also be displayed on the display 16.

Figure 2:
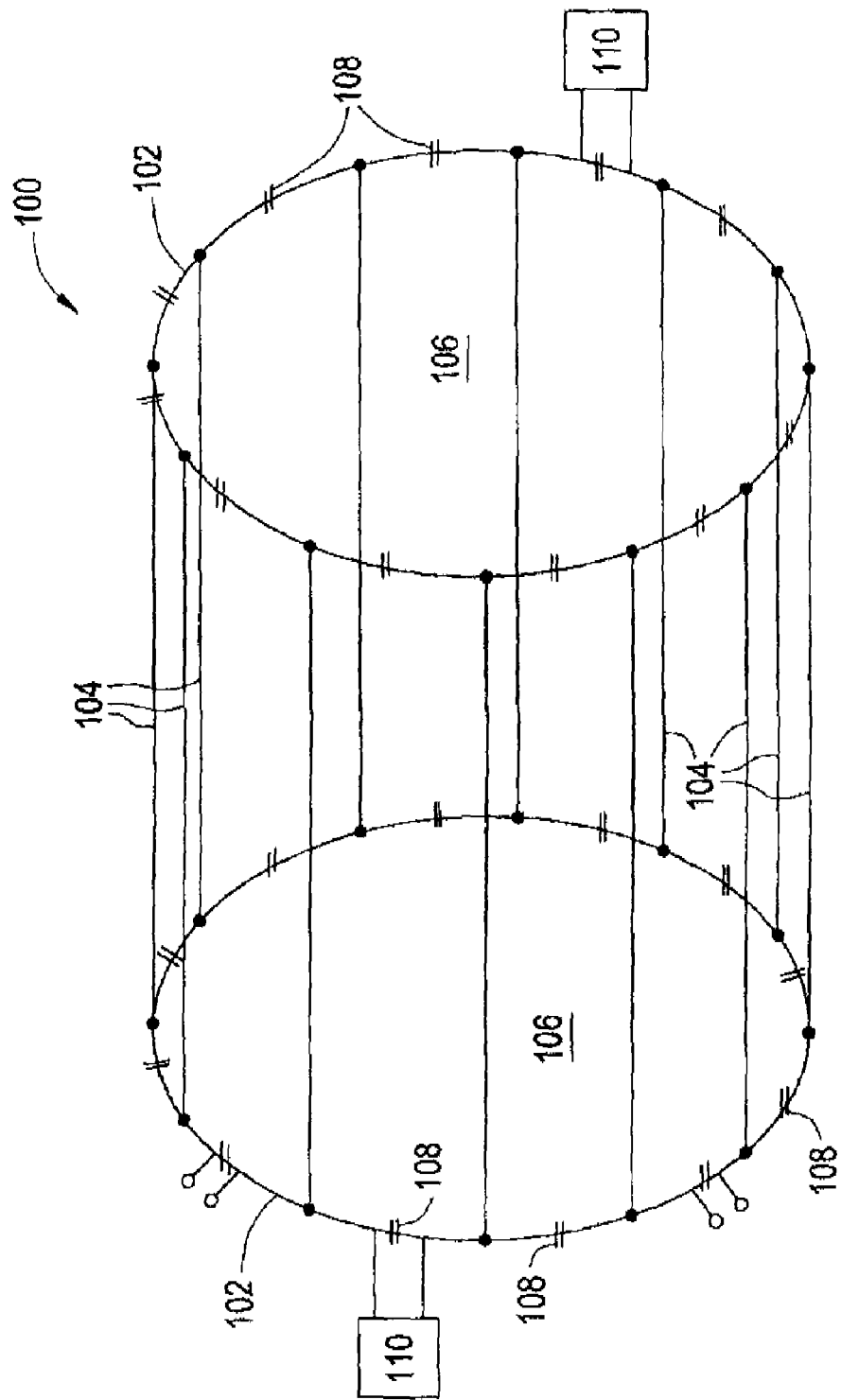
FIG. 2 is a schematic perspective view illustrating a configuration of an RF coil of the magnetic resonance imaging apparatus shown in FIG. 1.

FIG. 2 is a schematic diagram showing a structure of a coil body 100 included in the RF coil 66. The coil body 100 is configured as a so-called birdcage type coil and includes two conductive end loops (coil conductors) 102 and a plurality of conductors 104 cylindrically arranged around their central axes or patient bores 106 so as to electrically connect between the end loops 102. The end loops 102 and the conductors 104 define a cylindrical imaging volume. The coil body 100 is provided with a plurality of capacitors (electrostatic capacitive elements for coil) respectively connected in series with the end loops 102. The capacitors 108 are respectively disposed among the plural conductors 104. Further, the MRI system 10 includes at least one switching apparatus 110 electrically connected to the coil body 100.

A conventional switching apparatus will first be explained with reference to FIGS. 3 through 5, and the switching apparatus 110 according to the present embodiment will be described.

FIG. 3(a) is a circuit diagram showing a configuration of the conventional switching apparatus 110', and FIG. 3(b) is a circuit diagram showing an equivalent circuit of the conventional switching apparatus 110', respectively.

The switching apparatus 110' is provided with semirigid coaxial cables 122'. The coaxial cable 122' includes an inner conductor 124', an insulator 126' that surrounds the inner conductor 124', and an outer conductor 128' that surrounds the insulator 126'. The inner conductor 124' and the outer conductor 128' are respectively connected to an end loop 102 at one end side (the left side of the sheet) of the coaxial cable 122' with a capacitor 108 interposed therebetween. A bias input device 156 is connected to the other end side (the left side of the sheet) of the inner conductor 124', and a bias is applied to the other end side of the coaxial cable 122'.

The inner conductor 124' and the outer conductor 128' are connected by a diode 138' in the midstream of the coaxial cables 122'. When the diode 138' is forward-biased, a current flows from the inner conductor 124' to the outer conductor 128'. When the diode 138' is reverse-biased, no current flows between the inner conductor 124' and the outer conductor 128'.

In the coaxial cables 122', a length 146' from the end thereof on the capacitor 108 side to a portion thereof connected to the diode 138' is set to ¼ of a wavelength λ corresponding to an operating frequency of the RF coil 66 at transmission. A length 140' from the end thereof on the capacitor 108 side to the end of the other is set to ¼ to ½ of the wavelength λ.

Figure 4A:
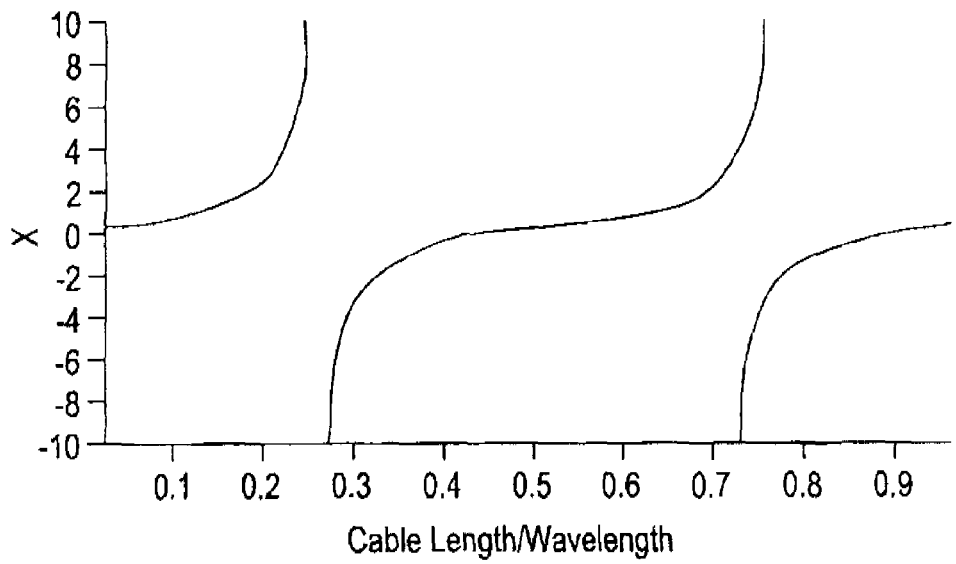
FIGS. 4a and 4b are diagrams showing electric characteristics of a coaxial cable.

Upon transmission, a forward bias is applied to the diode 138'. At this time, the coaxial cable 122' indicates electrical characteristics of a coaxial cable having a short-circuited end such as shown in FIG. 4(a). In FIG. 4(a), the horizontal axis indicates the ratio of the length of the coaxial cable 122' to the wavelength λ, and the vertical axis indicates impedance.

Figure 5A:
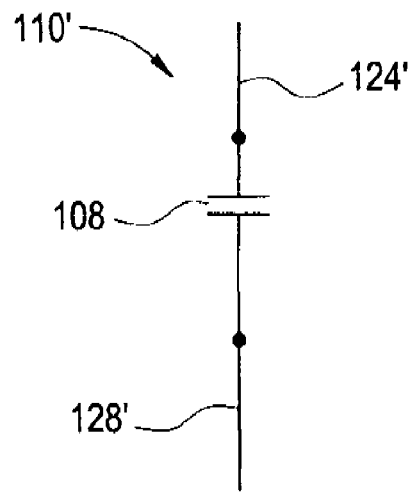
FIGS. 5a and 5b are diagrams showing an equivalent circuit of the switching apparatus of FIG. 3 while being in operation.

On the other hand, since the length 146' of the coaxial cable 122' is λ/4, the impedance of the coaxial cable 122' becomes infinite as shown in FIG. 4(a). Thus, as shown in FIG. 5(a), the switching apparatus 110' and the capacitor 108 become equivalent to the capacitor 108. That is, a current flows through the capacitor 108 so that the operation of the coil body 100 becomes effective.

Figure 4B:
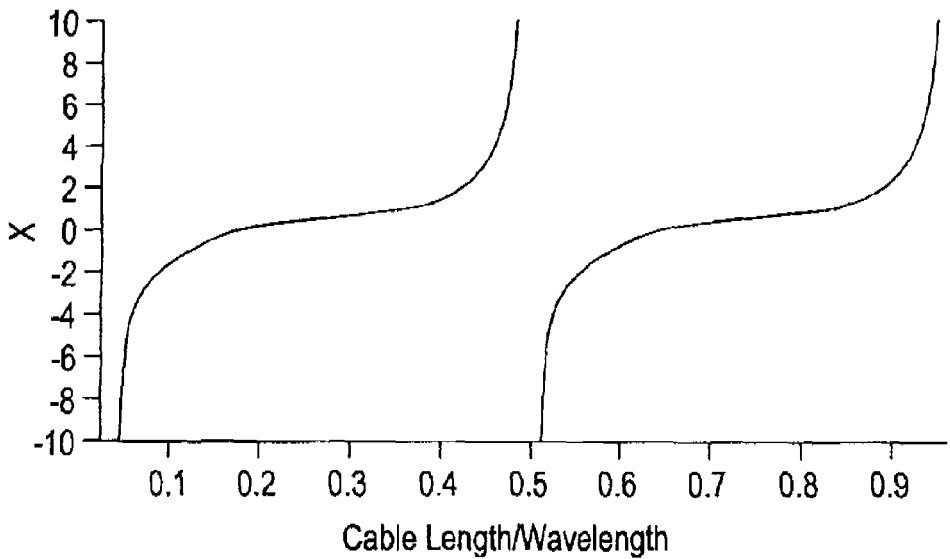

Upon reception, a reverse bias is applied to the diode 138'. At this time, the coaxial cable 122' indicates electrical characteristics of a coaxial cable having an open end such as shown in FIG. 4(b).

Figure 5B:
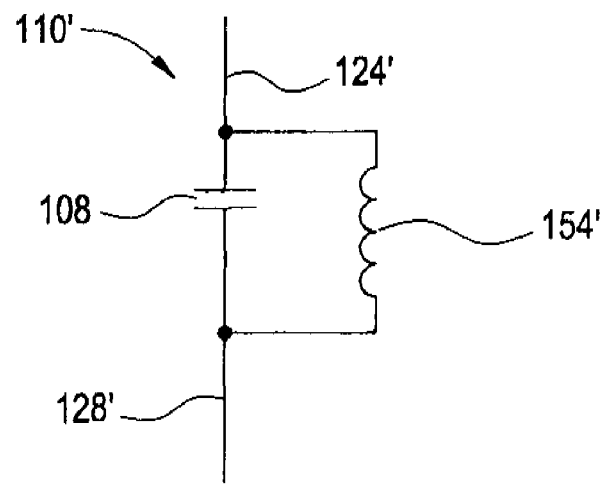

On the other hand, since the length 140' of the coaxial cables 122' is set to λ/4 to λ/2. As shown in FIG. 4(b), the impedance of the coaxial cable 122' becomes positive. That is, it functions as inductance. Thus, if the length 140' of the coaxial cables 122' is set as expressed by the following equation when the capacitance of the capacitor 108 is C and the inductance of the coaxial cable 122' is L:

$$\omega o = 2\pi f = 1/(CL)^{1/2},$$

the switching apparatus 110' and the capacitor 108 become equivalent to a parallel resonant circuit as shown in FIG. 5(b). That is, the capacitor 108 is brought to a state made non-conductive to the end loop 102, and the coil body 100 becomes ineffective.

In the switching apparatus 110 according to the present embodiment, its shortening can be attained by substituting a portion (portion obtained by subtracting the length 146' from the length 140') of the coaxial cables 122' from the connected position of the diode 138' to the applied side of the bias with a capacitor corresponding to a lumped constant element equivalent to the portion.

Figure 6:
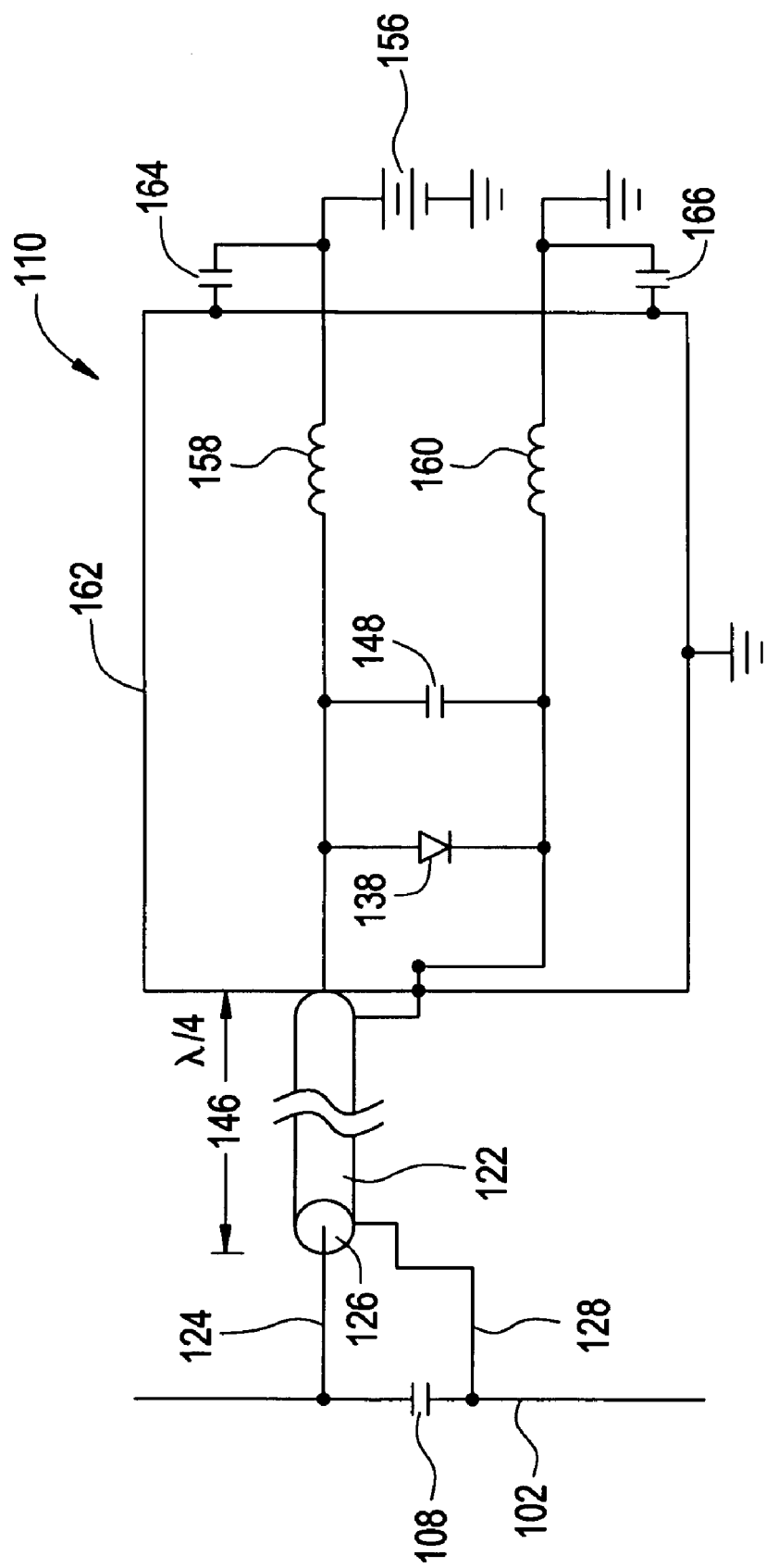
FIG. 6 is a circuit diagram illustrating a configuration of a switching apparatus provided in the RF coil shown in FIG. 2.

FIG. 6 is a circuit diagram showing a configuration of the switching apparatus 110. The switching apparatus 110 is provided with a semirigid coaxial cable 122. The coaxial cable 122 includes an inner conductor 124 made of a metal material, an insulator 126 that covers the inner conductor 124, an outer conductor 128 made of a metal material, which covers the insulator 126, and an unillustrated outer sheath that covers the outer conductor 128. Incidentally, the outer conductor 128 is formed of copper, for example.

In the coaxial cable 122, its overall length 146 is set to ¼ of a wavelength λ corresponding to the operating frequency of the RF coil 66 at transmission. When the operating frequency is 300 MHz, for example, the overall length is about 20 cm, whereas when the operating frequency is 130 MHz, the overall length is about 50 cm. At one end side (the left side of the sheet) of the coaxial cable 122, the inner conductor 124 and the outer conductor 128 are respectively connected to an end loop 102 with a capacitor 108 interposed therebetween.

The switching apparatus 110 includes a diode 138, a capacitor (lumped constant element) 148, inductors 158 and 160, and a shield case (shield body for the switching apparatus) 162 that shields these elements, all of which are connected to the other end side (bias input side) of the coaxial cable 122.

The diode 138 is connected to the inner conductor 124 and the outer conductor 128. When the diode 138 is forward-biased, a current flows from the inner conductor 124 to the outer conductor 128. When the diode 138 is reverse-biased, no current flows between the inner conductor 124 and the outer conductor 128. Incidentally, although FIG. 6 illustrates the case in which the diode 138 is disposed in such a manner that the direction from the inner conductor 124 to the outer conductor 128 is set to the forward direction, the diode 138 may be provided in the direction opposite to the direction shown in FIG. 6.

The capacitor 148 is connected to the inner conductor 124 and the outer conductor 128 in shunt with the diode 138. The capacitor 148 is made up of a capacitor corresponding to a lumped constant element. The capacitor 148 is constituted of, for example, a ceramic capacitor or a mica capacitor.

The capacitor 148 is of a capacitor equivalent to a portion (portion obtained by subtracting the length 146' from the length 140') of the coaxial cables 122' of the switching apparatus 110' shown in FIG. 3(*a*), which extends from the connected position of the diode 138' to the applied side of the bias. Thus, the electrostatic capacitance of the capacitor 148 is set in such a manner that when the diode 138 is reverse-biased, a resonant circuit with an operating frequency at transmission as a resonant frequency is configured of the capacitor 108, the coaxial cable 122 and the capacitor 148.

Described specifically, the above is expressed as follows. Assuming that the characteristic impedance of the coaxial cable is Zo and the electrostatic capacitance of the capacitor 148 is $C_2$, the equivalent reactance of the $\lambda/4$-wavelength coaxial cable 122 and the capacitor 148 is expressed in the following equation:

$$X = Zo^2 / (-j \times 1/(\omega o C_2))$$
$$= j\omega o C_2 Zo^2$$

That is, the inductance L of the $\lambda/4$-wavelength coaxial cable 122 and the capacitor 148 is expressed as follows:

$$L = C_2 Zo^2$$

Thus, when the operating frequency is $\omega o$ and the electrostatic capacitance of the capacitor 108 is $C_1$, $C_2$ may be set such that the following equation is established:

$$\omega o = 1/(C_1 L)^{1/2} = 1/(C_1 C_2 Zo^2)^{1/2}$$

The inductor 158 is connected in series with the outer conductor 124 on the bias input side than the capacitor 148. The inductor 160 is connected in series with the inner conductor 122 on the bias input side than the capacitor 148. The inductors 158 and 160 respectively function as low-pass filters for preventing the mixing of noise due to the application of a bias. The inductances of the inductors 158 and 160 are respectively 600 nH where the operating frequency of the RF coil 66 is 300 MHz, for example.

The shield case 162 is constituted of a non-magnetic material having conductivity. The shield case 162 is made up of a copper foil plate, for example. The shield case 162 is configured in such a shape as to be capable of shielding the diode 138, the capacitor 148 and the inductors 158 and 160. For instance, the shield case 162 is shaped in the form of a box capable of accommodating these elements therein. The shield case 162 is connected to a reference potential.

On the outer side of the shield case 162, there are provided a capacitor 164 whose one end side is connected to the bias input side of the inductor 158 and whose other end side is connected to the shield case 162, and a capacitor 166 whose one end side is connected to the bias input side of the inductor 160 and whose other end side is connected to the shield case 162. Each of the capacitors 164 and 166 functions as a filter which causes a bias's high frequency component to escape to the reference potential and prevents the mixing of noise due to the bias.

The input of the bias to the switching apparatus 110 is performed by a bias input device 156. The bias input device 156 is connected to, for example, the inner conductor 124 and applies a forward or reverse bias at the diode 138. The operation of the bias input device 156 is controlled by the system controller 34.

The system controller 34 controls the bias input means in such a manner that, for example, the forward bias is applied upon transmission to render the RF coil 66 effective and the reverse bias is applied upon reception to make the RF coil 66 ineffective. Thus, coupling at the time that a high-frequency magnetic field is formed at a subject by the RF coil 66 used as, for example, a body coil, and a magnetic resonance signal from the subject is received by a receive-only coil constituted of a phased array coil or the like, is suppressed.

Figure 7:
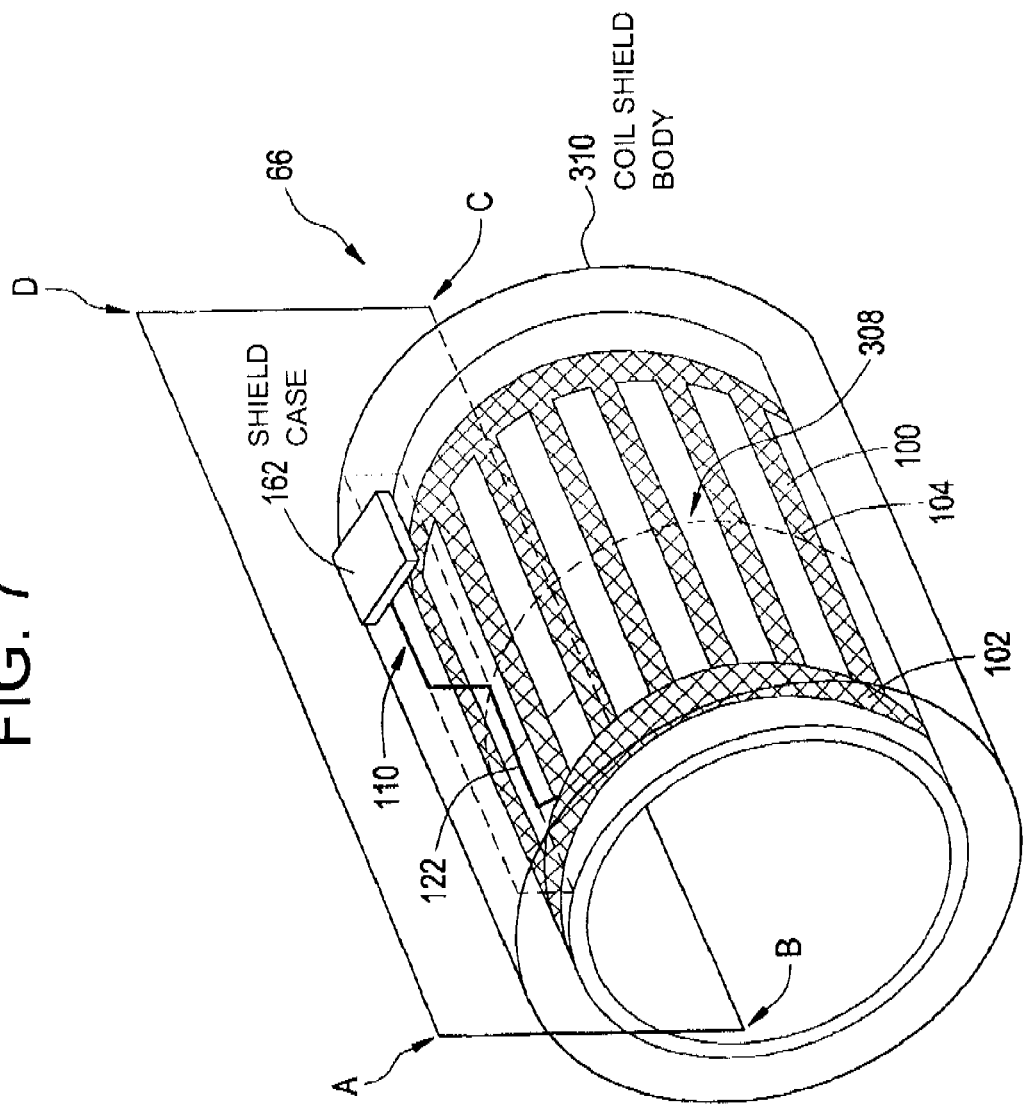
FIG. 7 is a diagram showing a method for packaging the RF coil shown in FIG. 2.

FIG. 7 is a perspective view showing a method for packaging the coil body 100 and the switching apparatus 110 employed in the RF coil 66.

The RF coil 66 is provided with a cylindrical RF shield (coil shield body) 310 which includes the coil body 100 therein and shields it. The RF shield 310 is formed of a conductor and connected to the reference potential. The coaxial cable 122 of the switching apparatus 110 is connected to the coil body 100 inside the RF shield 310 and extends in parallel with each conductor 104 inside the RF shield 310. Thereafter, the coaxial cable 122 extends outside the RF shield 310 and extends to the shield case 162. Incidentally, the coaxial cable 122 extends from the inside of the RF shield 310 to its outside at a virtual ground point 308. The virtual ground point 308 is located substantially midway between the end loops 102 and 102 and corresponds to such a position that the potential substantially reaches the reference potential.

FIG. 8 is a sectional view taken along a plane ABCD shown in FIG. 7. The coaxial cable 122 is fixed to the RF shield 310 by, for example, soldering its outer sheath. By, for example, soldering the shield case 162 to the RF shield 310, the shield case 162 is fixed to the RF shield 310 and electrically connected thereto, and connected to the reference potential. Incidentally, solder functions as fixing means having conductivity.

According to the above embodiment, the distributed constant element configured of the $\lambda/4$-wavelength coaxial cable 122 is connected to the capacitor 108 of the RF coil 66. Upon transmission, the coaxial cable 122 is short-circuited via the diode 138 to make the RF coil 66 effective, whereas upon reception, the coaxial cable 122 is not short-circuited. It is therefore possible to change the characteristic of the RF coil 66 from its characteristic at transmission upon reception. Since the impedance at reception is adjusted by the capacitor 148 corresponding to the lumped constant element, the switching apparatus 110 can be reduced or scaled down as compared with the case where the impedance at reception is adjusted by the distributed constant element.

Described specifically, since the electrostatic capacitance of the capacitor 148 is set such that the resonant circuit is configured where no coaxial cable 122 is short-circuited, the characteristic of the RF coil 66 as the resonant circuit can be lost upon reception.

Since the bias is applied to the diode 138 or the like through the inductors 158 and 160, the mixing of noise is prevented. Owing to the provision of the shield case 162, the emission of noise from the capacitor 148 or the like and its energy loss are suppressed. Allowing the bias's high-frequency component to escape through the capacitors 164 and 166 prevents the mixing of the noise. With the combination thereof with the inductors 158 and 160 in particular, the high frequency component is blocked by the inductors 158 and 160. Further, the emission of noise can efficiently be prevented by causing the blocked high frequency component to escape.

The RF coil 66 is provided with the RF shield 310 and the coaxial cable 122 is connected to the coil body 100 within the RF shield 310. Further, the other end thereof is disposed outside the RF shield 310, and the diode 138, the capacitor 148, etc. are mounted to the coaxial cable 122. Therefore, the mounting of the diode 138 and the like can be rendered easy, and wiring routing can be carried out without concern for the influence of stray components on the coil body 100.

Second Embodiment

An overall configuration of an MRI according to a second embodiment is similar to the first embodiment shown in FIGS. 1 and 2. Incidentally, constituents similar to the first embodiment are given reference numerals similar to those employed in the first embodiment below and their description will therefore be omitted. The MRI according to the second embodiment is different from the first embodiment in terms of the configuration of a switching apparatus.

A conventional switching apparatus will first be explained by referring to FIGS. 9 and 10, and a switching apparatus 210 according to the present embodiment will be described.

Figure 9A:
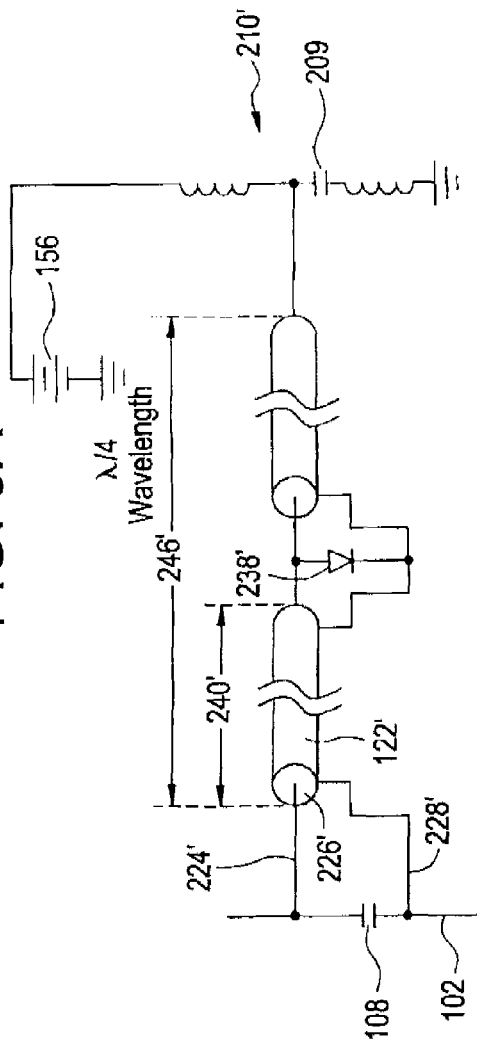
FIGS. 9a and 9b are circuit diagrams illustrating a configuration of a conventional switching apparatus.
Figure 9B:
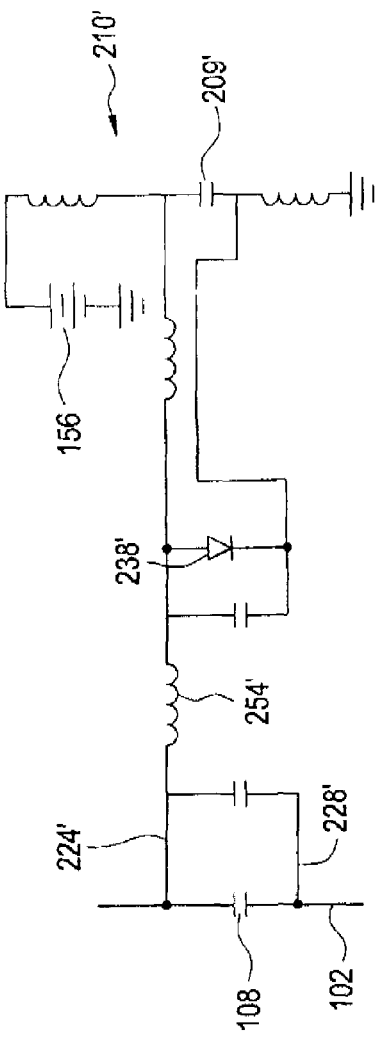

FIG. 9(a) is a circuit diagram showing a configuration of the conventional switching apparatus 210', and FIG. 9(b) is a circuit diagram showing an equivalent circuit of the conventional switching apparatus 210', respectively.

The switching apparatus 210' is provided with semirigid coaxial cables 222'. The coaxial cable 222' includes an inner conductor 224', an insulator 226' that surrounds the inner conductor 224', and an outer conductor 228' that surrounds the insulator 226'. The inner conductor 224' and the outer conductor 228' are respectively connected to an end loop 102 at one end side (the left side of the sheet) of the coaxial cable 222' with a capacitor 108 interposed therebetween. A bias input device 156 is connected to the other end side (the left side of the sheet) of the inner conductor 224', and a bias is applied to the other end side of the coaxial cable 222'. A length 246' from an end on the capacitor 108 side, of the coaxial cable 222' to an end on the bias input side, of the coaxial cable 222' is set to ¼ of a wavelength λ.

The inner conductor 224' and the outer conductor 228' are connected by a diode 238' in the midstream of the coaxial cables 222'. When the diode 238' is forward-biased, a current flows from the inner conductor 224' to the outer conductor 228'. When the diode 238' is reverse-biased, no current flows between the inner conductor 224' and the outer conductor 228'.

A capacitor 209' connected to the inner conductor 224' and the outer conductor 228' is provided at the end on the bias input side, of the coaxial cable 222'. The impedance of the capacitor 209' is set so as to be relatively small.

Upon transmission, a reverse bias is applied to the diode 238'. Since the impedance of the capacitor 209' is set so as to be relatively small at this time, the coaxial cable 222' indicates electrical characteristics that approximate the electrical characteristics of the coaxial cable having the short-circuited end such as shown in FIG. 4(a).

Figure 10A:
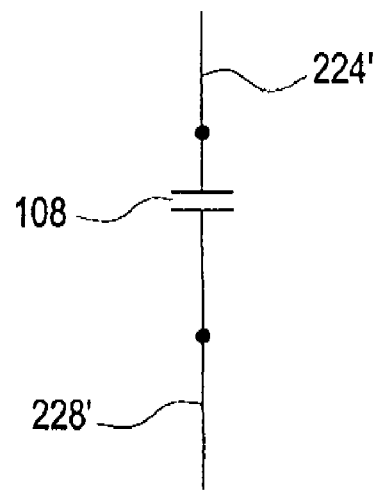
FIGS. 10a and 10b are diagrams showing an equivalent circuit of the switching apparatus of FIG. 9 while being in operation.

On the other hand, since the length 246' of the coaxial cable 222' is λ/4, the impedance of the coaxial cable 222' becomes infinite as shown in FIG. 4(a). Thus, as shown in FIG. 10(a), the switching apparatus 210 and the capacitor 108 become equivalent to the capacitor 108. That is, a current flows through the capacitor 108 so that the operation of the coil body 100 becomes effective.

Upon reception, a forward bias is applied to the diode 238'. At this time, the coaxial cable 222' indicates the electrical characteristics of the coaxial cable having the short-circuited end such as shown in FIG. 4(a).

Figure 10B:
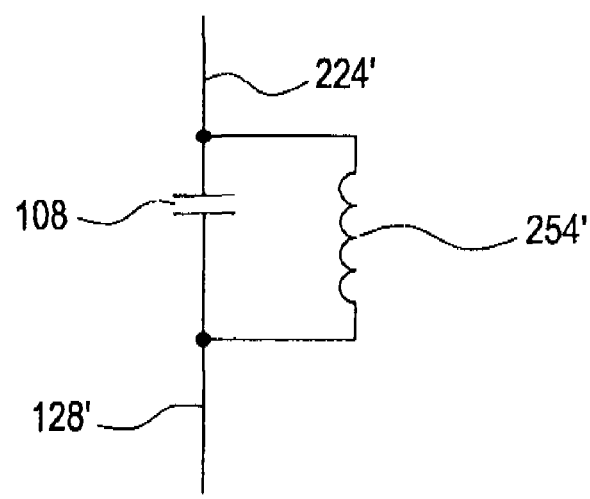

On the other hand, since the length 240' of the coaxial cable 222' is set to 0 to λ/4. As shown in FIG. 4(a), the impedance of the coaxial cable 222' becomes positive. That is, it functions as inductance. Thus, if the length 240' of the coaxial cable 222' is set as given by the following equation when the capacitance of the capacitor 108 is C and the inductance of the portion corresponding to the length 240' of the coaxial cable 222' is L:

$$\omega 0 = 2\pi f = 1/(CL)^{1/2},$$

the switching apparatus 210 and the capacitor 108 become equivalent to a parallel resonant circuit as shown in FIG. 10(b). That is, the capacitor 108 is brought to a state made non-conductive to the end loop 102, and the coil body 100 becomes ineffective.

In the switching apparatus 210 according to the present embodiment, its shortening can be attained by substituting a portion (portion obtained by subtracting the length 246' from the length 240') of the coaxial cables 222' from the connected position of the diode 138' to the applied side of the bias with an inductor corresponding to a lumped constant element equivalent to the portion.

Figure 11:
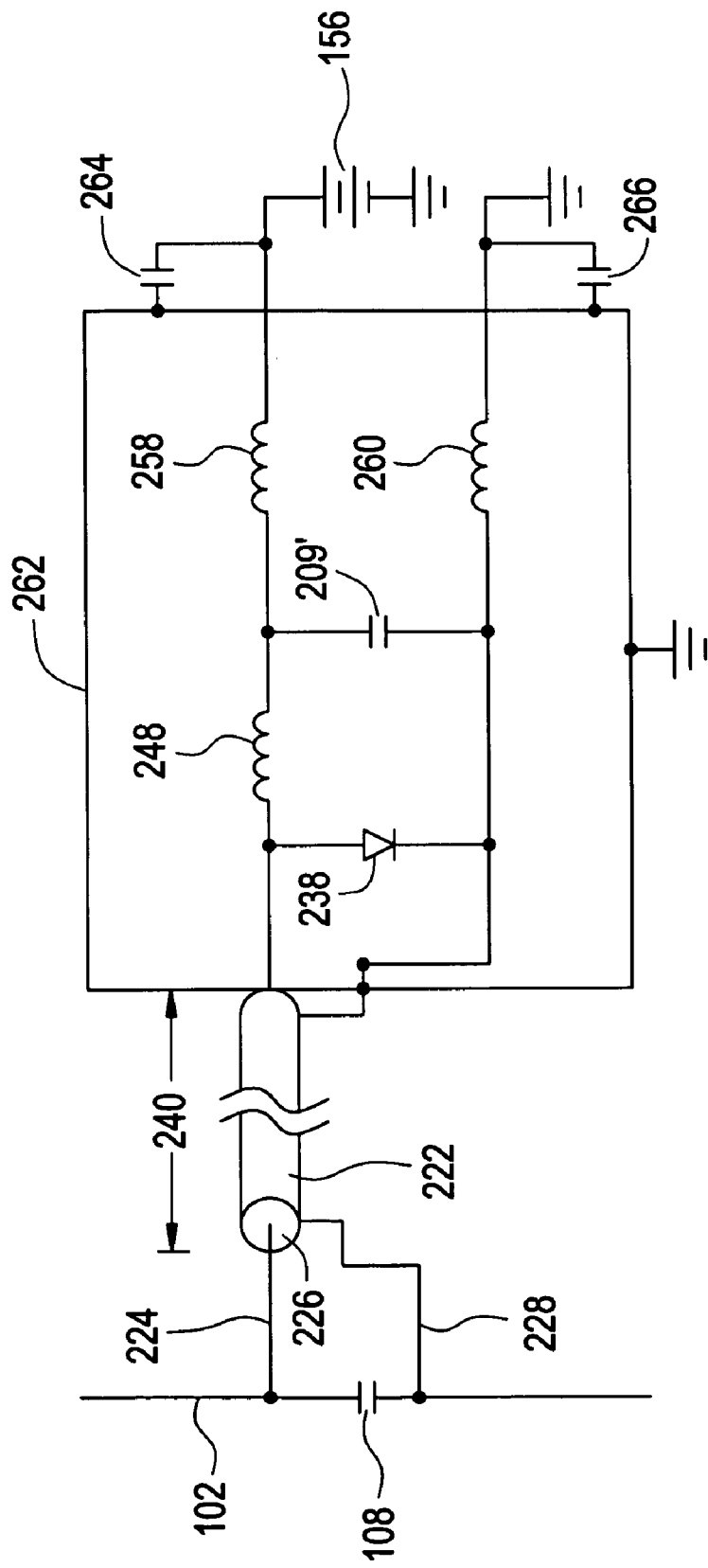
FIG. 11 is a circuit diagram illustrating a configuration of a switching apparatus employed in a magnetic resonance imaging apparatus according to a second embodiment of the present invention.

FIG. 11 is a circuit diagram showing a configuration of the switching apparatus 210. The switching apparatus 210 has a configuration substantially similar to the switching apparatus 110 according to the first embodiment shown in FIG. 6.

That is, the switching apparatus 210 is provided with such a coaxial cable 222 that on the one end side thereof, an inner conductor 224 is connected to one side of a capacitor 108 and an outer conductor 228 is connected to the other side of the capacitor 108, and a bias is applied to the other end thereof. The switching apparatus 210 is provided, on the bias input side of a coaxial cable 222, with a diode 238 connected to the inner conductor 224 and the outer conductor 228. The switching apparatus 210 is provided with a capacitor 209' connected to the inner conductor 224 and the outer conductor 228 on the bias input side of the coaxial cable 222. The switching apparatus 210 is provided, on the bias input side of the coaxial cable 222, with an inductor 258 connected in series with the inner conductor 224, and provided, on the bias input side thereof, with an inductor 260 connected in series with the outer conductor 228. The switching apparatus 210 is equipped with a shield case 262, which is formed of a non-magnetic material having conductivity and covers the capacitor 209' and the like. A capacitor 264 connected to the inner conductor 224 on the bias input side than the inductor 258 and connected to the shield case 262, and a capacitor 266 connected to the outer conductor 228 on the bias input side than the inductor 260 and connected to the shield case 262 are provided therein.

However, the switching apparatus 210 is provided with an inductor 248. The switching apparatus 210 is different from the switching apparatus 110 in terms of the length 246 of the coaxial cable 222 and the electrostatic capacitance of the capacitor 209' and also different therefrom even in terms of the direction of a bias where the RF coil 66 is made effective or ineffective.

The capacitor 209' is equivalent to the capacitor 209' employed in the conventional switching apparatus 210' shown in FIGS. 9(a) and 9(b) and is connected to the inner conductor 224 and the outer conductor 228 of the coaxial cable 222. The capacitor 209' is used to short-circuit the end on the bias input side, of the coaxial cable 222 with respect to a high frequency component. Its electrostatic capacitance is set relatively high (set low in reactance) as before.

The inductor 248 is connected in series with the capacitor 209'. In other words, the inductor 248 is connected to the inner conductor 224 and the outer conductor 228 at the end on the bias input side, of the coaxial cable 222 so as to be parallel with the diode 238. The inductor 248 may preferably be a non-magnetic inductor in terms of an improvement in SN ratio. Incidentally, the inductor 248 may be any of a winding inductor, a laminated inductor and a thin-film inductor. The inductor 248 may be either a lead wire type or a chip inductor. A suitable material may be used for a core, or an air core may be used.

When a forward bias is applied to the diode 222, the RF coil is rendered ineffective as shown in FIG. 10(b) in the switching apparatus 210. That is, the capacitor 108 and the coaxial cable 222 constitute a resonant circuit with its operating frequency as a resonant frequency. Thus, the length 240 of the coaxial cable 222 is set in a manner similar to the length 240' of the coaxial cable 222' shown in FIG. 9.

On the other hand, when a reverse bias is applied to the diode 222, the RF coil 66 is made effective as shown in FIG. 10(a) in the switching apparatus 210. That is, the combined impedance of the coaxial cable 222 and the inductor 248 becomes equal to the impedance where a short-circuited end of a coaxial cable having a length equal to an odd multiple of λ/4, that is, it becomes infinite. Thus, the inductance of the inductor 248 is set in such a manner that the impedance of the coaxial cable 222 used as a distributed constant element whose terminal is short-circuited by the capacitor 209' becomes infinite.

Incidentally, the mounting or packaging of the switching apparatus 210 may be carried out by a method similar to the packaging method of the switching apparatus 110 shown in FIGS. 7 and 8. According to the above embodiment, an advantageous effect similar to the first embodiment is obtained.

The present invention is not limited to the above embodiments. The present invention may be implemented in various forms.

The RF coil is not limited to the body coil or the birdcage type coil. One that performs at least any of the formation of a high-frequency magnetic field and the reception of a magnetic resonance signal may be used. For instance, a head coil or a surface coil may be used. One that performs only any one of the transmission and reception may be used, or one that performs both of them may be used.

The switching apparatus is not limited to such a type that the RF coil is disabled or made ineffective. The resonant frequency of the RF coil may simply be shifted. In this case, in the first embodiment, the electrostatic capacitance of the capacitor 148 may suitably be set in such a manner that the resonant frequency of the RF coil is shifted to a desired value. In the second embodiment, the length 240 of the coaxial cable 222 may suitably by set in such a manner that the resonant frequency of the RF coil is shifted to a desired value.

In the switching apparatus, whether the impedance of the switching apparatus should be increased than the other of the transmission and reception may suitably be set upon any one of the transmission and reception. For example, the switching apparatus is not limited to one wherein the RF coil is made effective upon transmission and the RF coil is made ineffective upon reception. The switching apparatus may be one wherein the RF coil is made ineffective upon transmission and the RF coil is made effective upon reception.

The length of the coaxial cable employed in the first embodiment is not limited to λ/4. The length thereof may be an odd multiple of λ/4.

Many widely different embodiments of the invention may be configured without departing from the spirit and the scope of the present invention. It should be understood that the present invention is not limited to the specific embodiments described in the specification, except as defined in the appended claims.

The invention claimed is:

1. A switching apparatus configured to switch a state of an RF coil of a magnetic resonance imaging apparatus between a state in which a resonant circuit with a predetermined operating frequency as a resonant frequency is configured, and a state in which one of the resonant circuit and a non-resonant circuit having another resonant frequency is configured, said switching apparatus comprising:
   a coaxial cable having a length equal to an odd multiple of ¼ of a wavelength corresponding to the operating frequency, said coaxial cable comprising:
      a first end at which an inner conductor is connected to a first side of a coil electrostatic capacitive element contained in the RF coil and an outer conductor is connected to a second side of the coil electrostatic capacitive element; and
      a second end from which a bias is applied;
   a diode connected to said inner conductor and said outer conductor at said second end of said coaxial cable;
   a lumped constant element connected to said inner conductor and said outer conductor in parallel with said diode at said second end of said coaxial cable, said lumped constant element having a predetermined electrostatic capacitance; and
   a shield case comprising a non-magnetic material having conductivity, said shield case covering said lumped constant element and positioned external to a coil shield body.

2. The switching apparatus according to claim 1, wherein the electrostatic capacitance of said lumped constant element is set in such a manner that when a bias is applied to said second end of said coaxial cable in a direction in which no current flows through said diode, the resonant circuit with the operating frequency as the resonant frequency comprises the coil electrostatic capacitive element, said coaxial cable, and said lumped constant element.

3. The switching apparatus according to claim 1, wherein said lumped constant element comprises a ceramic capacitor.

4. The switching apparatus according to claim 1, further comprising:
   a first electrostatic capacitive element connected to said inner conductor and connected to a reference potential at said first end of said coaxial cable; and
   a second electrostatic capacitive element connected to said outer conductor and connected to the reference potential at said first end of said coaxial cable.

5. The switching apparatus according to claim 1, wherein the operating frequency is at least 64MHz.

6. A switching apparatus configured to switch a state of an RF coil of a magnetic resonance imaging apparatus between a state in which a resonant circuit with a predetermined operating frequency as a resonant frequency is configured, and a state in which one of the resonant circuit and a non-resonant circuit having another resonant frequency is configured, said switching apparatus comprising:
 a coaxial cable comprising:
  a first end at which an inner conductor is connected to a first side of a coil electrostatic capacitive element contained in the RF coil and an outer conductor is connected to a second side of the coil electrostatic capacitive element; and
  a second end from which a bias is applied;
 a diode connected to said inner conductor and said outer conductor at said second end of said coaxial cable;
 a lumped constant element connected to said inner conductor and said outer conductor in parallel with said diode at said second end of said coaxial cable, said lumped constant element having an inductance such that when the bias is applied to said second end of said coaxial cable in a direction in which no current flows through said diode, a combined impedance of said diode and said coaxial cable becomes equivalent to an impedance of said coaxial cable with said second end short-circuited with a length equal to an odd multiple of ¼ of a wavelength corresponding to the operating frequency; and
 a shield case comprising a non-magnetic material having conductivity, said shield case covering said lumped constant element and positioned external to a coil shield body.

7. The switching apparatus according to claim 6, wherein a length of said coaxial cable is set in such a manner that when the bias is applied to said second end of said coaxial cable in a direction in which a current flows through said diode, the resonant circuit with the operating frequency as the resonant frequency comprises said coaxial cable and the coil electrostatic capacitive element.

8. The switching apparatus according to claim 6, further comprising:
 a first inductance element connected in series with said inner conductor at said first end of said coaxial cable; and
 a second inductance element connected in series with said outer conductor at said first end of said coaxial cable, wherein the bias is applied to said coaxial cable via said first inductance element and said second inductance element.

9. The switching apparatus according to claim 6, further comprising:
 a first electrostatic capacitive element connected to said inner conductor and connected to a reference potential at said first end of said coaxial cable; and
 a second electrostatic capacitive element connected to said outer conductor and connected to the reference potential at said first end of said coaxial cable.

10. The switching apparatus according to claim 6, wherein the operating frequency is at least 64 MHz.

11. The switching apparatus according to claim 6, wherein said lumped constant element comprises a ceramic capacitor.

12. An RF coil configured for use in a magnetic resonance imaging apparatus, said RF coil comprising:
 a coil shield body;
 a coil conductor;
 a coil electrostatic capacitive element connected to said coil conductor; and
 a switching apparatus configured to switch a state of a circuit comprising said coil conductor and said coil electrostatic capacitive element between a state in which a resonant circuit with a predetermined operating frequency as a resonant frequency is configured, and a state in which one of the resonant circuit and a non-resonant circuit having another resonant frequency is configured, wherein said switching apparatus comprises:
  a coaxial cable having a length equal to an odd multiple of ¼ of a wavelength corresponding to the operating frequency, said coaxial cable comprising:
   a first end at which an inner conductor is connected to a first side of said coil electrostatic capacitive element contained in said RF coil and an outer conductor is connected to a second side of said coil electrostatic capacitive element; and
   a second end from which a bias is applied;
  a diode connected to said inner conductor and said outer conductor at said second end of said coaxial cable;
  a lumped constant element connected to said inner conductor and said outer conductor in parallel with said diode at the said second end of said coaxial cable, said lumped constant element having a predetermined electrostatic capacitance; and
  a shield case comprising a non-magnetic material having conductivity, said shield case covering said lumped constant element and positioned external to said coil shield body.

13. The RF coil according to claim 12, wherein said shield case is fixed to said coil shield body by fixing means having conductivity.

14. The RF coil according to claim 12, wherein said coil shield body covers said coil conductor, wherein said first end of said coaxial cable is disposed inside said coil shield body and said second end of said coaxial cable is disposed outside said coil shield body, and wherein said lumped constant element is disposed outside said coil shield body such that said lumped constant element is covered by said shield case outside said coil shield body.

15. The RF coil according to claim 12, wherein the operating frequency is at least 64 MHz.

16. The RF coil according to claim 12, wherein said lumped constant element comprises a ceramic capacitor.

17. An RF coil configured for use in a magnetic resonance imaging apparatus, said RF coil comprising:
 a coil shield body;
 a coil conductor;
 a coil electrostatic capacitive element connected to said coil conductor; and
 a switching apparatus configured to switch a state of a circuit comprising said coil conductor and said coil electrostatic capacitive element between a state in which a resonant circuit with a predetermined operating frequency as a resonant frequency is configured, and a state in which one of the resonant circuit and a non-resonant circuit having another resonant frequency is configured, wherein said switching apparatus comprises:
  a coaxial cable comprising:
   a first end at which an inner conductor is connected to a first side of said coil electrostatic capacitive element contained in said RF coil and an outer conductor is connected to a second side of said coil electrostatic capacitive element; and
   a second end from which a bias is applied;
  a diode connected to said inner conductor and said outer conductor at said second end of said coaxial cable;

a lumped constant element connected to said inner conductor and said outer conductor in parallel with said diode at said second end of said coaxial cable, said lumped constant element having an inductance such that when the bias is applied to said second end of said coaxial cable in a direction in which no current flows through said diode, a combined impedance of said diode and said coaxial cable becomes equivalent to an impedance of said coaxial cable with said second end short-circuited with a length equal to an odd multiple of ¼ of a wavelength corresponding to the operating frequency; and a shield case comprising a non-magnetic material having conductivity, said shield case covering said lumped constant element and positioned external to said coil shield body.

18. The RF coil according to claim 17, wherein said coil shield body covers said coil conductor, wherein said first end of said coaxial cable is disposed inside said coil shield body and said second end of said coaxial cable is disposed outside said coil shield body, and wherein said lumped constant element is disposed outside said coil shield body such that said lumped constant element is covered by said shield case outside said coil shield body.

19. The RF coil according to claim 17, wherein said shield case is fixed to said coil shield body by fixing means having conductivity.

20. The RF coil according to claim 17, wherein the operating frequency is at least 64 MHz.

* * * * *